United States Patent

Iino et al.

[11] Patent Number: 5,911,821
[45] Date of Patent: Jun. 15, 1999

[54] METHOD OF HOLDING A MONOCRYSTAL, AND METHOD OF GROWING THE SAME

[75] Inventors: Eiichi Iino; Makoto Iida; Masanori Kimura, all of Annaka; Shozo Muraoka, Maebashi, all of Japan

[73] Assignee: Shin-Etsu Handotai Co., Ltd., Tokyo, Japan

[21] Appl. No.: 08/923,963

[22] Filed: Sep. 5, 1997

[30] Foreign Application Priority Data

Sep. 18, 1996 [JP] Japan ..................................... 8-267807

[51] Int. Cl.⁶ .................................................. C30B 15/04
[52] U.S. Cl. .............................. 117/13; 117/208; 117/218; 117/911
[58] Field of Search .................................. 117/13, 14, 15, 117/208, 218, 911

[56] References Cited

U.S. PATENT DOCUMENTS

| 4,190,630 | 2/1980 | Apilat et al. ............................. 117/217 |
| 5,126,113 | 6/1992 | Yamagishi et al. ...................... 117/218 |
| 5,196,086 | 3/1993 | Kida et al. ................................. 117/35 |
| 5,487,355 | 1/1996 | Chiou et al. ............................... 117/13 |

FOREIGN PATENT DOCUMENTS

| A-0671491 | 9/1995 | European Pat. Off. . |
| A-0747512 | 12/1996 | European Pat. Off. . |
| A-62-288191 | 12/1987 | Japan . |
| A-63-252991 | 10/1988 | Japan . |
| A-3-285893 | 12/1991 | Japan . |
| A-3-295893 | 12/1991 | Japan . |
| 407172981 | 7/1995 | Japan . |
| A-9-2893 | 1/1997 | Japan . |

OTHER PUBLICATIONS

K. M. Kim et al., "Maximum Length of Large Diameter Czochralski Silicon Single Crystals at Fracture Stress Limit of Seed," *Journal of Crystal Growth*, vol. 100, No. 3, Mar. 1, 1990, pp. 527–528.

*Primary Examiner*—Felisa Hiteshew
*Attorney, Agent, or Firm*—Oliff & Berridge, PLC

[57] ABSTRACT

There is disclosed a Czochralski method in which a seed crystal in contact with material melt is pulled, while being rotated, so as to grow a monocrystal, and a part of the crystal being grown is mechanically held during the pulling operation. The crystal is mechanically held in such a way that the weight W(kg) of the crystal satisfies the following Formula (1):

$$W < 12.5 \times \pi D^2 / 4 \qquad (1)$$

where D designates the minimum diameter (mm) of a neck. This makes it possible to pull a heavy monocrystal safely and reliably.

18 Claims, 2 Drawing Sheets

METHOD OF HOLDING A MONOCRYSTAL, AND METHOD OF GROWING THE SAME

BACKGROUND OF THE INVENTION

1. Field of the Invention

The present invention relates to a method of holding a monocrystal which allows a heavy monocrystal to be pulled irrespective of the strength of a seed crystal or a neck by mechanically holding a part of the crystal during the course of the growth of the same by a so-called Czochralski (CZ) method. The present invention also relates to a method of growing a monocrystal in which the above-described method of holding a monocrystal is utilized.

2. Description of the Related Art

The Czochralski method has been known as a method of manufacturing a semiconductor material such as silicon. As shown in FIG. 3A, according to this method, a seed crystal 52 held by a seed holder 51 is brought into contact with the surface of material melt 54 contained in a crucible 53. The seed crystal 52 is then pulled while being rotated. At this time, the pulling speed is controlled such that a neck 55 is formed below the seed crystal 52. Subsequently, there is formed a body 56 which is a monocrystal having a large diameter.

The formation of the neck 55 permits elimination of dislocations from the body 56 of the monocrystal formed after the neck 55. In recent years the weight of the crystal has tended to increase due to an increase in the diameter of a monocrystal and an improvement of manufacturing efficiency, and consequently the strength of the seed crystal 52 and the neck 55 have tended to become insufficient. If the crystal that is being grown falls as a result of fracture of the neck during the course of the pulling of the crystal, a serious accident may occur. In order to prevent such an accident, as shown in FIG. 3B, there has been adopted a method and apparatus which enable mechanical holding of a part of the crystal during the course of growth of the crystal.

In this apparatus, a stepped engagement portion 57 consisting of an increased-diameter portion and a reduced-diameter portion is formed between the neck 55 and the body (a straight cylindrical portion of a crystal) 56, and the crystal is pulled while lifting jigs 58, 58 hold the stepped engagement portion 57. Examples of such a technique are described in, e.g., Japanese Patent Application Laid-open (kokai) Nos. 62-288191, 63-252991, 3-285893, and 3-295893. For instance, in the apparatus disclosed in JP-A No. 3-285893, a stepped engagement portion is formed while a seed crystal is pulled, and when the stepped engagement portion reaches a position corresponding to gripping levers disposed at a predetermined height, the gripping levers grip and pull the stepped engagement portion.

In practice, the timing at which the crystal being grown is mechanically held cannot be simply determined for several reasons, as will be described later, thereby posing a considerable problem.

More specifically, a part of a crystal that is being grown cannot be mechanically held before the crystal has been grown to a certain extent. However, in terms of prevention of the fall of the crystal due to fracture of the neck, it is desirable to hold the crystal as soon as possible, before the crystal grows to become heavy.

In order to achieve the above, the crystal may be held immediately after the portion of the crystal to be chucked is formed during the growth of the crystal. However, in this case, the crystal must be held right above the material melt, so that a holding device is directly exposed to the high-temperature material melt (a temperature not less than 1400° C. for silicon), thereby resulting in faulty operations or alteration of the quality of the material of the holding device. Further, the material melt may be contaminated by impurities.

If the crystal that is being grown is subjected to mechanical stress while still remaining at elevated temperature, plastic deformations may arise in the crystal, which in turn would cause slip dislocation in the crystal being grown. If such slip dislocation is generated in the crystal that is being grown, the mechanical strength of the area of the crystal where the slip dislocation is generated decreases, thereby imposing a risk of fracture for that area when the crystal has grown to become heavy.

Further, if the crystal is grown to be equal to or greater than a certain weight, the seed crystal or the neck may not bear the weight and hence may fracture. For this reason, it is necessary to grow the crystal to a weight less than the critical weight of the crystal being grown or to mechanically hold the crystal before the weight of the crystal has reached the critical weight.

Particularly in recent years, the diameter of a monocrystal grown by the Czochralski method has become increasingly greater with an increase in the degree of integration of semiconductor devices. For silicon, there is demand for a monocrystal having a diameter of greater than 8 inches, particularly a monocrystal having a diameter of greater than 12 inches.

For the case of the growth of such a crystal having a large diameter, even if the crystal is grown to a slight extent, the crystal will be grown to become heavy. Therefore, the crystal being grown must be mechanically held as soon as possible. In contrast, during the growth of a crystal having a large diameter, a high-temperature region inevitably extends over a wide area of the crystal. Therefore, before the crystal is grown to a certain extent, the temperature of the portion of the crystal to be held does not decrease to a temperature at which plastic deformation does not arise.

The critical weight of the crystal that is being grown is complicatedly affected by various factors, such as the geometry of the seed crystal or the neck, particularly the diameter, the quality of the crystal, the growing temperature and the types of stress exerted on the crystal (tensile stress, torsional stress, or bending stress). For this reason, accurate determination of the critical weight by calculation is difficult.

SUMMARY OF THE INVENTION

Accordingly, an object of the present invention is to safely and reliably pull a crystal being grown by the Czochralski method while a part of the crystal is mechanically held, by means of determining conditions for the timing at which the crystal is mechanically held.

To achieve the foregoing object, in accordance with a first aspect of the invention, there is provided a method of holding a monocrystal used with the Czochralski method in which a seed crystal in contact with material melt is pulled, while being rotated, so as to grow a monocrystal, and a part of the crystal being grown is mechanically held during the pulling operation. The method of holding a monocrystal is characterized in that the crystal is mechanically held in such a way that the weight (W kg) of the crystal satisfies the following Formula (1):

$$W < 12.5 \times \pi D^2 / 4 \tag{1}$$

where D designates the minimum diameter (mm) of a neck.

If the weight W of the crystal being grown is determined so as to satisfy Formula (1) at the time of mechanical holding of a part of the crystal, the risk of fall of the crystal being grown due to the fracture of the neck can be reduced to become considerably small.

In accordance with a second aspect of the present invention, there is provided a method of holding a monocrystal used with the Czochralski method in which a seed crystal in contact with material melt is pulled, while being rotated, so as to grow a monocrystal, and a part of the crystal being grown is mechanically held during the pulling operation. The method of holding a monocrystal is characterized in that the crystal is mechanically held when the temperature of the portion of the crystal to be held becomes equal to or less than 550° C.

As described above, if the crystal that is being grown is mechanically held when the temperature of the portion of the crystal to be held becomes equal to or less than 550° C., plastic deformation stemming from stress will not arise in the crystal since the crystal being grown is sufficiently cool. As a result, slip dislocation will not be generated in the crystal that is being grown. Consequently, there is no possibility that the mechanical strength of the portion of the crystal to be held is decreased, and that this portion fractures when the crystal is grown to become heavy.

Preferably, if the crystal that is being grown is mechanically held while the weight of the crystal is determined so as to satisfy Formula (1), and if the temperature of the portion of the crystal to be held is made equal to or less than 550° C., the risk of fracture of the neck caused by the weight of the crystal being grown will be reduced, and plastic deformation will not arise in the portion of the crystal to be held.

Preferably, in order to satisfy Formula (1) and/or to make the temperature of the portion of the crystal to be held equal to or less than 550° C. as described above, the distance between the lower end of the portion of the crystal to be held and a body of the crystal is controlled.

In accordance with a third aspect of the present invention, there is provided a method of growing a monocrystal used with the Czochralski method in which a seed crystal in contact with material melt is pulled, while being rotated, so as to grow a monocrystal, and a part of the crystal being grown is mechanically held during the pulling operation, wherein one of the previously-described methods of holding a monocrystal is employed.

As described above, according to one of the previously-described methods, since the crystal that is being grown can be held without causing the fracture of the neck and plastic deformation in the portion of the crystal to be held, a heavy monocrystal can be pulled safely and reliably.

The methods of the present invention are particularly useful for pulling silicon monocrystals whose diameter and weight have been increasing in recent years.

DESCRIPTION OF THE INVENTION AND EMBODIMENT

Figure 1:
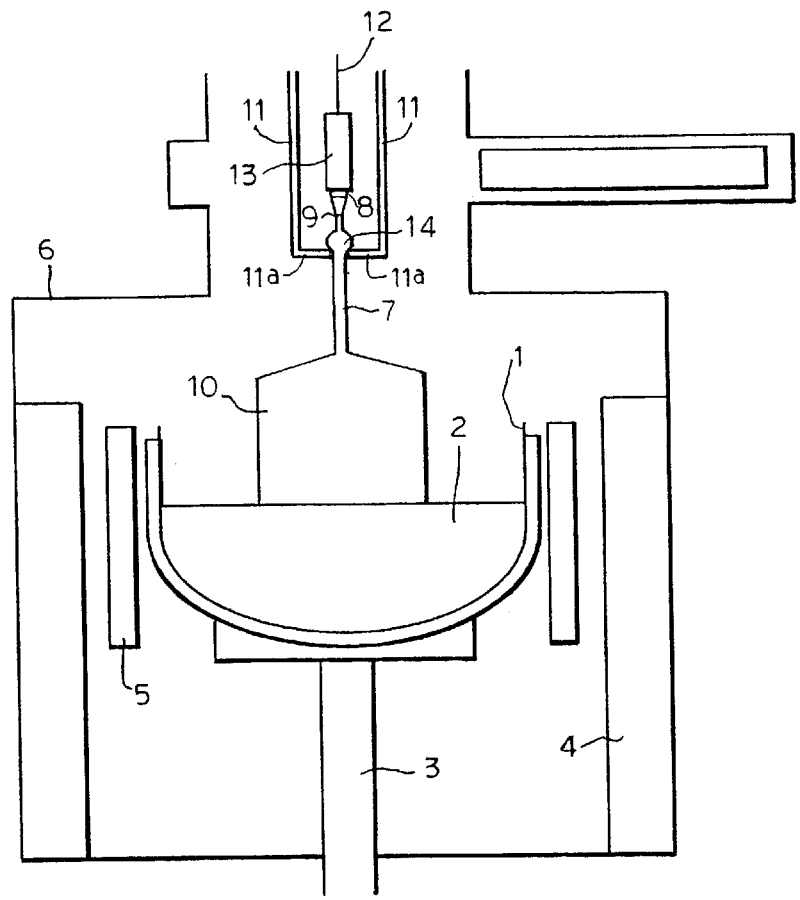
FIG. 1 is an explanatory view showing one example of a case where a crystal is pulled according to a monocrystal pulling method of the present invention.

The present invention will now be described in a more detailed in reference to the growth of a silicon monocrystal. However, the invention is not limited thereto.

The inventors of the present invention have carried out studies on the safe and reliable pulling of a crystal being grown, in terms of the timing at which the crystal being grown is mechanically held. The studies have resulted in the discovery that, in order to determine the timing, it is essential to know the withstand load of the neck (or the critical weight of the crystal being grown) and the temperature at which plastic deformation arises in the crystal being grown due to stress.

As has been described above, the withstand load and the plastic deformation temperature are affected by various factors, and hence it is difficult to accurately determine them by calculation or the like. For this reason, the withstand load characteristics of the neck and the plastic deformation temperature are actually measured, as a result of which a proper timing for holding a crystal was successfully determined in consideration of safety factor and dispersion in the tests.

More specifically, the neck of a monocrystal actually manufactured by the Czochralski method was subjected to a tensile test through use of a tensile tester. The mean tensile strength of the neck was found to be 16.2 kgf/mm$^2$ (n=125, standard deviation ($\sigma$)=3.7 kgf/mm$^2$). All the data are within the range of the mean value ±1$\sigma$. * It was acknowledged that the strength of the neck is determined by subtracting the standard deviation from the mean value, i.e., (16.2−3.7= 12.5). Since this strength of 12.5 kgf/mm$^2$ is a force per unit area, it can be converted into a strength of the neck (diameter: D); i.e., (12.5×$\pi$D$^2$/4). Provided that D designates the minimum diameter of the neck, where the risk of fracture is greatest, the withstand load of the neck can be calculated. Accordingly, if the weight (wkg) of the crystal being grown satisfies Formula (1), the risk of fall of the crystal being grown due to the fracture of the neck can be reduced to become very small.

$$W < 12.5 \times \pi D^2/4 \tag{1}$$

With regard to the temperature of plastic deformation, tests were performed to determine the temperature at which slip dislocation was generated. More specifically, the neck of the crystal actually manufactured by the Czochralski method was pulled under a load of 20 kg through use of a tensile tester while the neck was heated at temperatures ranging from 400 to 800° C. Slip dislocation was generated at temperatures of not less than 600° C. but plastic deformation was not generated at temperatures of not greater than 550° C. From these results, it is understood that if the crystal being grown is mechanically held after the temperature of the portion of the crystal to be held is made equal to or less than 550° C., plastic deformation does not arise in the portion of the crystal to be held, and the risk of fracture of the same portion which would otherwise be caused by a reduction in the strength is reduced significantly.

Next, in reference to the accompanying drawings, the present invention will be described with respect to a case where a silicon monocrystal is grown. However, the present invention is not limited to the growth of the silicon monocrystal.

Figure 2:
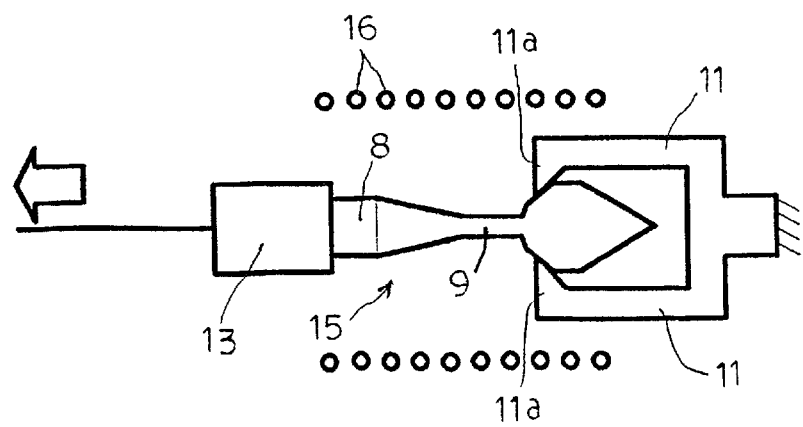
FIG. 2 is a schematic explanatory view showing a tensile test for a neck performed in the present invention.
Figure 3A:
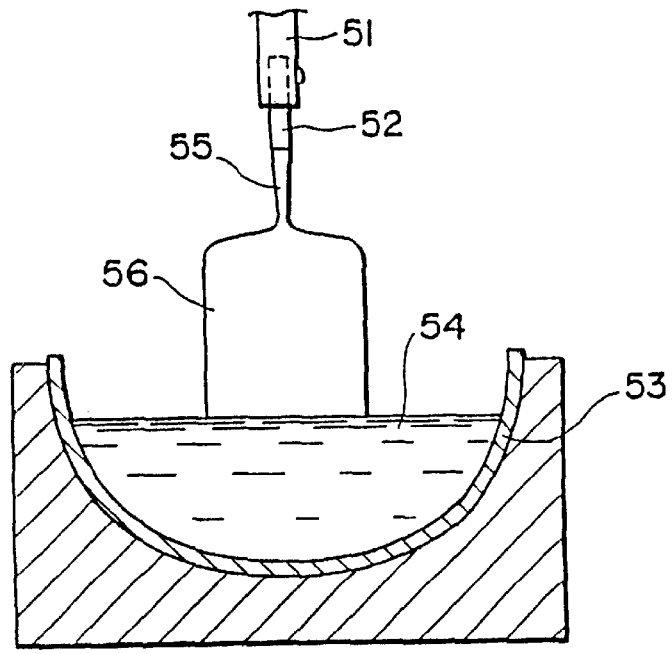
FIGS. 3A and 3B are explanatory views showing a conventional Czochralski method and a conventional method of holding a crystal, respectively.
Figure 3B:
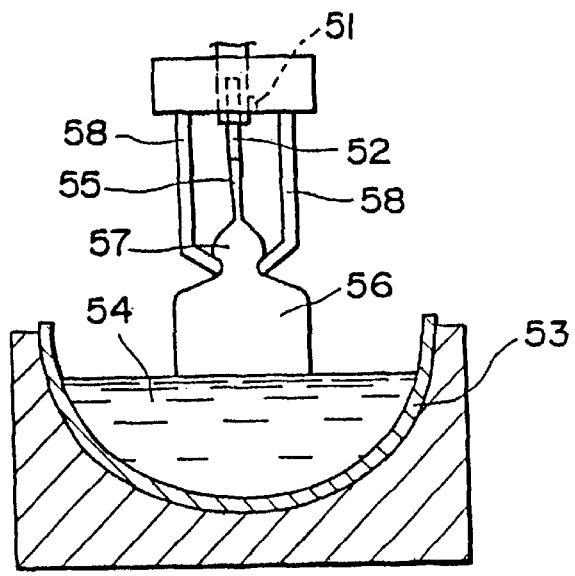

First, a tensile test performed in the present invention will be described with reference to FIG. 2.

A universal tester (not shown) used for an ordinary tensile test of metal or the like was employed as a tensile tester. A resistance heater 16 was disposed to surround a sample 15 to heat the periphery of the sample 15. The heating was performed in the air under normal pressure.

The sample 15 was a crystal actually manufactured by the Czochralski method. Specifically, a neck 9 was formed after a seed crystal 8 used for pulling an ordinary crystal, and the diameter of the crystal was increased to thereby form the sample 15 having a profile as shown in FIG. 2. The diameter of the crystal was increased from a midpoint in the neck 9 so as to form a body part of the sample 15 which was a dislocation-free monocrystal. The seed crystal 8 was a square of 10 mm×10 mm dimensions, and the maximum diameter of the body part was about 50 mm.

The seed crystal 8 of the sample 15 was held by the seed holder 13, which is the same as that used for growing an ordinary crystal. Similarly, the body part was held by a holding device 11, which is the same as that used for mechanically holding an ordinary crystal being grown.

This sample 15 was subjected to a tensile test while being set in the universal tester having the foregoing heating mechanism.

One example of the results of the tensile tests performed through use of the tester having the foregoing construction is provided below. The sample 15 was pulled at a rate of 1 mm/min, which is substantially equal to a growth rate of the crystal, while the temperature was maintained at each preset temperature. The pulling of the sample 15 was stopped at a point in time when the load had reached 150 kgf, and the sample 15 was left as it was for ten minutes. The thus-obtained sample 15 was determined whether or not the neck had been fractured during the pulling operation or then etched to determine whether or not slip dislocation was generated in the neck.

Table 1 shows the test results.

TABLE 1

| Temperature at portion to be held | Minimum diameter D of neck (mm) | | |
|---|---|---|---|
| | 3.0 | 4.0 | 4.5 |
| 550° C. | Neck fractured | No problem occurred | No problem occurred |
| 600° C. | Neck fractured | Slip dislocation | Slip dislocation |
| 700° C. | Neck fractured | Slip dislocation | Slip dislocation |

As can be seen from Table 1, the neck fractured in the case where the minimum diameter D of the neck was 3 mm and therefore Formula (1) was not satisfied. In contrast, no fracture arose in the neck in the case where the minimum diameter D of the neck was 4 mm and therefore Formula (1) was satisfied.

Further, in the case where the temperature of the portion of the crystal to be held was equal to or greater than 600° C., plastic deformation arose in the crystal, thereby resulting in slip dislocation in the crystal. In contrast, in the case where the temperature of the portion to be held was equal to or less than 550° C., no slip dislocation was generated.

With reference to FIG. 1, an explanation will be given of one example of the case where a part of a crystal is mechanically held in accordance with the present invention in order to pull the crystal.

In FIG. 1, a quartz crucible 1 for containing silicon melt 2 is rotated by a rotary shaft 3. A cylindrical heater 5 made of, e.g., graphite, is disposed around the crucible 1. A heat-insulating cylinder 4 is provided outside the heater 5, as required. A magnetic-field generator (not shown) consisting of a permanent magnet or an electromagnet may be disposed outside a chamber 6, as required.

A seed crystal 8 consisting of monocrystalline silicon is pulled along its center axis by means of a pulling mechanism (not shown) while being rotated. A crystal holding device 11 is arranged so that it can mechanically hold the crystal when the crystal has been grown to a certain length.

With the foregoing apparatus, the present invention will be practiced in the following manner.

The seed crystal 8 attached to the seed holder 13 provided at the tip end of a wire 12 is brought into contact with the surface of the material melt 2 contained in the crucible 1. The wire 12 is pulled at a given rate by means of a pulling mechanism (not shown) while being gently rotated, whereby a monocrystal is grown after the seed crystal 8. The neck 9 used for forming the crystal into a monocrystal is formed, and a stepped engagement portion 14 for the purpose of mechanical chucking is formed. A body 10 is then formed. At this time, holding portions 11a, 11a of the crystal holding device 11 are in the open position. When the stepped engagement portion 14 provided between the neck 9 and the body 10 reaches a certain height to be located between the holding portions 11a, 11a during the course of the pulling of the crystal performed by means of the wire 12, this is sensed by a sensor (not shown). The crystal holding device 11 is then actuated, so that the stepped engagement portion 14 is pinched and mechanically held by the holding portions 11a, 11a.

The crystal is held in such a way that the weight W(kg) of the grown crystal satisfies Formula (1). More specifically, the crystal is mechanically held before it is grown to be a weight which does not satisfy Formula (1).

In this case, the stepped engagement portion 14 of the crystal to be held is mechanically held after the temperature of the engagement portion 14 becomes equal to or less than 550° C.

An explanation will be given of a specific weight of the monocrystal to be grown. In a case where the minimum diameter of the neck is 3 mm, the critical weight of the crystal that satisfies Formula (1) is about 88 kg. In a case where a crystal is grown to have a diameter of 12 inches (305 mm), the weight of the crystal exceeds 88 kg at the point in time when the length of the body becomes about 48 cm, provided that the weight of the cone portion of the crystal is 5 kg.

As described above, in the case where a heavy crystal is pulled by the Czochralski method, the crystal being grown can be reliably pulled without causing the fracture of the neck or plastic deformation of the portion of the crystal to be held.

If a crystal to be grown is further increased in diameter, the weight of the crystal will increase quickly as a result of slight growth of the crystal. As a result, before the stepped engagement portion 14 reaches a predetermined height, the weight of the crystal will exceed the weight that satisfies Formula (1).

Further, an elevated-temperature region inevitably extends over a wide range of the crystal during the growth of the crystal having a large diameter, and hence the temperature of the stepped engagement portion 14 itself is elevated. Therefore, the temperature of the stepped engagement portion 14 will not decrease to 550° C. or less unless the engagement position at which the crystal being grown is mechanically held is raised further.

In this case, there arises a doubt that the present invention cannot be actually practiced. However, the present invention can be readily practiced, so long as the distance between the lower end of the portion of the crystal to be held and the upper end of the body is adjusted.

More specifically, if the crystal is formed into a monocrystal by means of the neck 9, and the stepped engagement portion 14 and the body 10 are formed after the neck 9, the conditions characterizing the present invention may not be satisfied. However, if the length of the portion 7 between the portion of the crystal to be held and the body is increased, the weight defined by Formula (1) can be satisfied, and the temperature of the stepped engagement portion 14 can be reduced to 550° C. or less.

If the portion 7 is increased in length or diameter more than required, the manufacturing yield of the crystal and productivity will be deteriorated. Therefore, the distance 7 is set in such a way that the temperature of the engagement portion 14 is reduced to a temperature of 550° C. or less, and that the minimum diameter D of the neck satisfies Formula (1).

The position where the temperature of the stepped engagement portion 14 becomes 550° C. or less can be easily known by measuring in advance the inside temperature of the crucible within the crystal pulling apparatus, because the temperature of the crystal being grown is substantially equal to the ambient temperature.

The present invention is not limited to the above-described embodiment. The above-described embodiment is a mere example, and those having the substantially same structure as that described in the appended claims and providing the similar action and effects are included in the scope of the present invention.

What is claimed is:

1. A method of holding a monocrystal used with the Czochralski method, comprising the steps of:

pulling a seed crystal in contact with a material melt, while rotating the seed crystal, so as to grow a monocrystal; and mechanically holding a portion of the crystal such that the weight W (kg) of the crystal satisfies the following Formula (1):

$$W<12.5\times\pi D^2/4 \qquad (1)$$

where D designates the minimum diameter (mm) of a neck of the crystal.

2. A method of holding a monocrystal according to claim 1, wherein the crystal is mechanically held after the temperature of the portion of the crystal to be held is made equal to or less than 550° C.

3. A method of holding a monocrystal according to claim 2, wherein Formula (1) is satisfied and the temperature of the portion of the crystal to be held is made equal to or less than 550° C., by adjusting the distance between a lower end of the portion of the crystal to be held and a body of the monocrystal.

4. A method of growing a monocrystal in accordance with the Czochralski method, comprising the steps of:

pulling a seed crystal in contact with a material melt, while rotating the seed crystal, so as to grow a monocrystal; and mechanically holding a portion of the crystal in accordance with the method of claim 3.

5. A method of growing a monocrystal in accordance with the Czochralski method, comprising the steps of:

pulling a seed crystal in contact with a material melt, while rotating the seed crystal, so as to grow a monocrystal; and mechanically holding a portion of the crystal in accordance with the method of claim 2.

6. A method of growing a monocrystal according to claim 5, wherein the crystal to be grown is a silicon monocrystal.

7. A method of holding a monocrystal according to claim 2, wherein the crystal to be grown is a silicon monocrystal.

8. A method of holding a monocrystal according to claim 1, wherein Formula (1) is satisfied by adjusting the distance between a lower end of the portion of the crystal to be held and a body of the crystal.

9. A method of growing a monocrystal in accordance with the Czochralski method, comprising the steps of:

pulling a seed crystal in contact with a material melt, while rotating the seed crystal, so as to grow a monocrystal; and mechanically holding a portion of the crystal in accordance with the method of claim 8.

10. A method of growing a monocrystal in accordance with the Czochralski method, comprising the steps of:

pulling a seed crystal in contact with a material melt, while rotating the seed crystal, so as to grow a monocrystal; and mechanically holding a portion of the crystal in accordance with the method of claim 1.

11. A method of growing a monocrystal according to claim 10, wherein the crystal to be grown is a silicon monocrystal.

12. A method of holding a monocrystal according to claim 1, wherein the crystal to be grown is a silicon monocrystal.

13. A method of holding a monocrystal used with the Czochralski method, comprising the steps of:

pulling a seed crystal in contact with a material melt, while rotating the seed crystal, so as to grow a monocrystal; and mechanically holding a portion of the crystal after the temperature of the portion of the crystal to be held is made equal to or less than 550° C.

14. A method of holding a monocrystal according to claim 13, wherein the temperature of the portion of the crystal to be held is made equal to or less than 550° C. by adjusting a distance between the lower end of the portion of the crystal to be held and a body of the crystal.

15. A method of growing a monocrystal in accordance with the Czochralski method, comprising the steps of:

pulling a seed crystal in contact with a material melt, while rotating the seed crystal, so as to grow a monocrystal; and mechanically holding a portion of the crystal in accordance with the method of claim 14.

16. A method of growing a monocrystal in accordance with the Czochralski method, comprising the steps of:

pulling a seed crystal in contact with a material melt, while rotating the seed crystal, so as to grow a monocrystal; and mechanically holding a portion of the crystal in accordance with the method of claim 13.

17. A method of growing a monocrystal according to claim 16, wherein the crystal to be grown is a silicon monocrystal.

18. A method of holding a monocrystal according to claim 13 wherein the crystal to be grown is a silicon monocrystal.

* * * * *